United States Patent
Kobayashi

(10) Patent No.: US 6,713,397 B2
(45) Date of Patent: Mar. 30, 2004

(54) MANUFACTURING METHOD OF SEMICONDUCTOR DEVICE

(75) Inventor: Yasutaka Kobayashi, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 40 days.

(21) Appl. No.: 09/942,224

(22) Filed: Aug. 30, 2001

(65) Prior Publication Data

US 2002/0160612 A1 Oct. 31, 2002

(30) Foreign Application Priority Data

Apr. 27, 2001 (JP) ........................................ 2001-133115

(51) Int. Cl.$^7$ ............................................. H01L 21/20
(52) U.S. Cl. ...................... 438/696; 438/585; 438/669; 438/720; 438/721; 438/742
(58) Field of Search ................................. 438/585, 669, 438/696, 720, 721, 742

(56) References Cited

U.S. PATENT DOCUMENTS

| | | | | | |
|---|---|---|---|---|---|
| 5,296,093 | A | * | 3/1994 | Szwejkowski et al. | 216/13 |
| 5,660,681 | A | * | 8/1997 | Fukuda et al. | 438/695 |
| 5,695,572 | A | * | 12/1997 | Brunner et al. | 134/3 |
| 5,904,570 | A | * | 5/1999 | Chen et al. | 438/735 |
| 6,057,240 | A | * | 5/2000 | Zhou et al. | 438/689 |
| 6,087,264 | A | * | 7/2000 | Shin et al. | 438/706 |
| 6,517,738 | B1 | * | 2/2003 | Torek et al. | 252/79.1 |

FOREIGN PATENT DOCUMENTS

JP     2000-196087     7/2000

* cited by examiner

*Primary Examiner*—Robert Kunemund
(74) *Attorney, Agent, or Firm*—Volentine Francos, PLLC

(57) ABSTRACT

A gate electrode layer formed on a semiconductor substrate is etched. A gate electrode is formed while forming metal system sub-products onto the side walls of the gate electrode layer. The metal system sub-products formed on the side walls of the gate electrode layer are oxidized. The oxidized metal system sub-products are removed by a solution whose etching rate for the gate insulative film has been adjusted to 10 Å/min or less.

21 Claims, 6 Drawing Sheets

MANUFACTURING METHOD OF SEMICONDUCTOR DEVICE

BACKGROUND OF THE INVENTION

1. Field of the Invention

The invention relates to a manufacturing method of a semiconductor device and, more particularly, to a manufacturing method of a semiconductor device having a gate electrode which is formed on a gate insulative film on a semiconductor substrate and at least a part of which is made of a metal material.

2. Related Background Arts

In recent years, to realize high integration and high speed of an LSI, for example, a gate electrode having a laminate structure including a metal material layer of a high melting point such as tungsten (W) or the like and a polysilicon layer showing conductivity has been being developed. The electrode structure of such a multilayer is an indispensable technique after the future design reference generation of 0.13 $\mu$m. It is earnestly being examined to apply it to devices.

A conventional forming method of a gate electrode of a polysilicon-metal multilayer structure including a polysilicon layer and a metal film will now be described hereinbelow with reference to FIGS. 5(a) to 5(c). FIGS. 5(a) to 5(c) are cross sectional step diagrams showing the conventional forming method of the gate electrode having the polysilicon-metal multilayer structure.

First, as shown in FIG. 5(a), a gate oxide film 302 having a film thickness of, for example, 30 Å, a conductive polysilicon film 303 having a film thickness of, for example, 1000 Å and containing a conductive impurity, a W/WN$_x$ laminate film 304 having a film thickness of, for example, 1000 Å and consisting of tungsten and tungsten nitride, a silicon nitride film (Si$_3$N$_4$) 305 having a film thickness of, for example, 3000 Å, and a photoresist film 306 are sequentially laminated onto a silicon substrate 301. The Si$_3$N$_4$ film 305 plays a role of a reflection preventing film in a photolithography step to the photoresist film 306. A part of the silicon nitride film 305 is used as an etching mask in the subsequent working step of the gate electrode.

Subsequently, as shown in FIG. 5(b), the photoresist film 306 is subjected to a patterning work comprising exposing and developing processes according to a photolithography technique so as to become a predetermined shape (gate electrode shape) which is necessary for working the gate electrode.

A patterned photoresist film 306a is used as an etching mask and the silicon nitride film 305 is subjected to a selective etching process by an RIE (Reactive Ion Etching) method. An etched silicon nitride film 305a is used as an etching mask and in a state where the photoresist film 306a remains on the mask, the lower laminate film 304 and polysilicon film 303 are sequentially subjected to a selective etching process.

Thus, as shown in FIG. 5(c), the Si$_3$N$_4$ film 305a is used as an etching mask and a gate electrode consisting of a W/WN$_x$ laminate film 304a and a polysilicon film 303a is formed under the film 305a. According to the RIE method, an organic system sub-product 307 is formed on the side surface of the gate electrode including the Si$_3$N$_4$ film by a reaction between an etching gas and a photoresist material remaining on the etching mask 305a. Since the organic system sub-product 307 is formed on the side surface of the gate electrode, each side surface of the Si$_3$N$_4$ film 305a, W/WN$_x$ laminate film 304a, and polysilicon film 303a is not excessively etched but the gate electrode which maintains a vertical shape is formed.

Subsequently, as shown in FIG. 6, the organic system sub-product 307 is removed by an etching dissolution by using a treatment solution containing a hydrogen peroxide solution (H$_2$O$_2$) such as sulfate peroxide solution (sulfate+hydrogen peroxide solution), ammonia peroxide solution (ammonia+hydrogen peroxide solution), or the like, or an interface between the organic system sub-product 307 and the gate electrode is peeled off by using a hydrofluoric acid solution by an etching operation, thereby removing the organic system sub-product 307.

As mentioned above, the gate electrode consisting of the polysilicon film 303a and W/WN$_x$ laminate film 304a is formed.

However, the conventional forming method of the gate electrode including the metal layer film has the following problems in the removing step of the organic system sub-product formed on the side surface of the gate electrode.

<1> In case of removing the organic system sub-product by using the treatment solution containing (H$_2$O$_2$) such as sulfate peroxide solution, ammonia peroxide solution, or the like, there is a problem such that the metal material (W/WN$_x$ laminate film) constructing the gate electrode is oxidized by the treatment solution and eluted, a thickness of metal layer film is reduced, and the gate electrode is extinguished. Further, the eluted metal components also become causes of various contamination.

<2> In case of removing the organic system sub-product by using the hydrofluoric acid solution, if an etching rate of the hydrofluoric acid treatment solution is too high, there is a fear such that the gate oxide film which is exposed from the gate electrode is extinguished at a position below the gate electrode. When the gate oxide film portion is extinguished, this oxide film portion cannot be used as a protective film for ion implantation for a source and a drain after the formation of the gate. When the oxide film portion is extinguished, there is a problem such that the hydrophobic silicon substrate is exposed. When the hydrophobic silicon substrate is exposed, in a cleaning step after the gate electrode was formed, a water droplet of a cleaning liquid is adhered onto the exposed silicon substrate and becomes a cause of occurrence of watermark-shaped dry defectives.

SUMMARY OF THE INVENTION

It is, therefore, an object of the invention to provide a novel and improved manufacturing method of a semiconductor device which can prevent an elution of a gate electrode material and prevent an extinction of a gate insulative film.

To accomplish the above object, according to the first aspect of the invention, there is provided a manufacturing method of a semiconductor device in which a gate electrode at least a part of which is made of a metal material is formed on a gate insulative film formed on a semiconductor substrate, comprising the steps of: forming the gate electrode while forming metal system sub-products onto side walls of the gate electrode, by etching a gate electrode layer formed on the semiconductor substrate; oxidizing the metal system sub-products formed on the side walls of the gate electrode; and removing the oxidized metal system sub-products by a solution whose etching rate for the gate insulative film is adjusted to be equal to or less than 10 Å/min.

According to the second aspect of the invention, there is provided a manufacturing method of a semiconductor device in which a gate electrode at least a part of which is made of a metal material is formed on a gate insulative film formed on a semiconductor substrate, comprising the steps of:

sequentially forming the gate insulative film, a gate electrode layer at least a part of which is made of a metal material, and a silicon nitride film or a silicon oxide film onto the semiconductor substrate; etching the silicon nitride film or silicon oxide film into a predetermined shape; forming the gate electrode while forming metal system sub-products onto side walls of the gate electrode, by etching the gate electrode layer with using the silicon nitride film or silicon oxide film etched in the predetermined shape as a mask; oxidizing the metal system sub-products formed on the side walls of the gate electrode; and removing the oxidized metal system sub-products.

The step of removing the oxidized metal system sub-products may be executed by using an ammonium fluoride solution.

In the ammonium fluoride solution, an etching rate for the gate insulative film may be adjusted to be equal to or less than 10 Å/min.

A solvent of the ammonium fluoride solution is, for example, a solvent of a low dielectric constant.

The solvent of the low dielectric constant is a material such as acetic acid or tetrahydrofuran.

The step of removing the oxidized metal system sub-products may be executed by using sulfate.

In the sulfate, an etching rate for the gate insulative film may be adjusted to be equal to or less than 10 Å/min.

It is preferable that the sulfate is a non-hydrolyzed sulfate stock solution.

The step of removing the oxidized metal system sub-products may be executed by using hydrochloric acid.

In the hydrochloric acid, an etching rate for the gate insulative film may be adjusted to be equal to or less than 10 Å/min.

Preferably, the hydrochloric acid is a non-hydrolyzed hydrochloric acid stock solution.

For example, the metal system sub-product is a product which is formed by a reaction of a metal material constructing the gate electrode and an etching material which is used in the etching of the gate electrode layer in the etching step of the gate electrode layer.

The metal system sub-product is, for example, a product containing at least $WCl_6$.

The etching of the gate electrode layer may be executed by a reactive ion etching method.

Preferably, the step of oxidizing the metal system sub-products formed on the side walls of the gate electrode is ashing with using oxygen.

According to the third aspect of the invention, there is provided a manufacturing method of a semiconductor device having a gate electrode which is formed on a gate oxide film on a semiconductor substrate and has a metal material layer, comprising the steps of: depositing a gate electrode layer for the gate electrode onto the gate oxide film; forming a reflection preventing film layer and a photoresist material layer made of an organic material onto the gate electrode layer, respectively; forming a resist mask in a desired shape from the photoresist material layer by a photolithography technique; performing a selective etching process to the reflection preventing film layer by using the resist mask as an etching mask, thereby forming an etching mask corresponding to the resist mask from the reflection preventing film layer; removing the resist mask, thereafter, performing an etching process to remove a portion exposed from the etching mask in the gate electrode layer under the etching mask by using the etching mask obtained from the reflection preventing film layer, and sequentially growing etching protective films of a metal system onto side portions in a remaining portion of the gate electrode layer locating under the etching mask during the etching process in order to protect the side portions from the etching process; oxidizing the metal system protective films; and removing the oxidized protective films from the remaining portion of the gate electrode layer.

The reflection preventing film may be either a silicon nitride film or a silicon oxide film.

The metal system protective films may be removed by using an ammonium fluoride solution.

The metal system protective films may be removed by using a liquid showing strong acid.

The above and other objects and features of the present invention will become apparent from the following detailed description and the appended claims with reference to the accompanying drawings.

DETAILED DESCRIPTION OF THE PREFERRED EMBODIMENTS

Figure 1A:
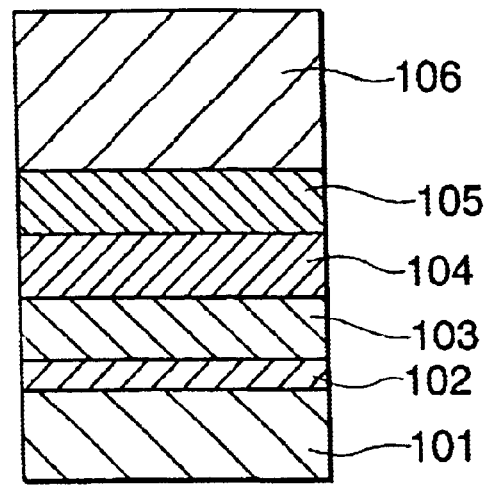
FIGS. 1(a) to 1(c) are cross sectional step views showing a manufacturing method of a semiconductor device according to the first embodiment of the invention.
Figure 1B:
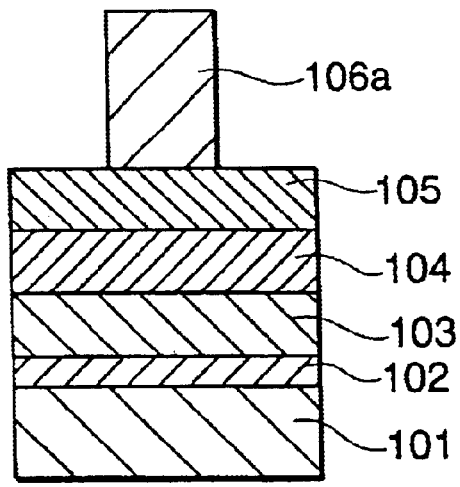
Figure 1C:
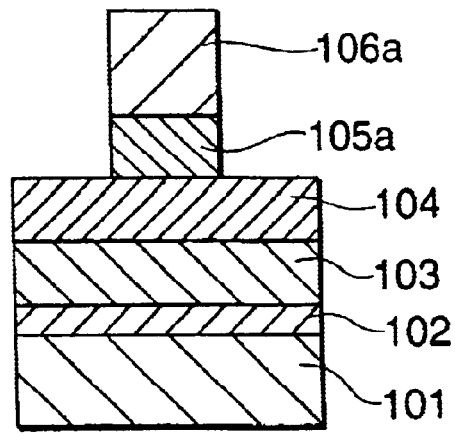
Figure 2A:
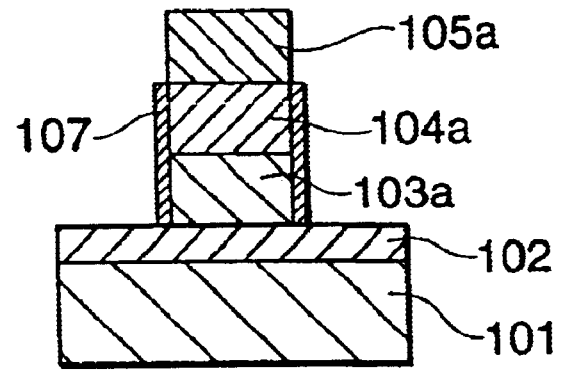
FIGS. 2(a) and 2(b) are cross sectional step views showing the manufacturing method of the semiconductor device according to the first embodiment.
Figure 2B:
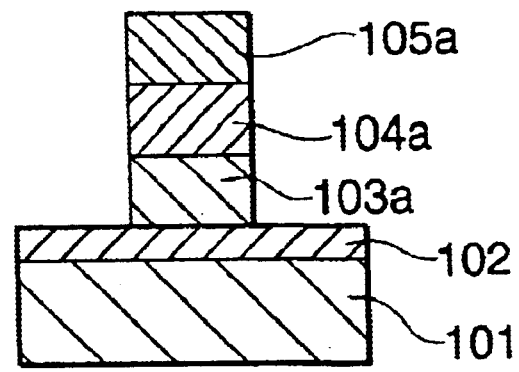

Preferred embodiments of the invention will now be described in detail hereinbelow with reference to the drawings. In the following description and drawings, component elements having substantially the same functions and constructions are designated by the same reference numerals and their overlapped description is omitted here.

[First Embodiment]

A manufacturing method of a semiconductor device according to the first embodiment will be first explained with reference to FIGS. 1(a) to 1(c), 2(a), and 2(b). FIGS. 1(a) to 1(c), 2(a), and 2(b) are cross sectional step views showing the manufacturing method of the semiconductor device according to the first embodiment.

First, as shown in FIG. 1(a), a gate insulative film (for example, a gate oxide film) 102 having a film thickness of, for example, 30 Å, a conductive polysilicon film 103 having a film thickness of, for example, 1000 Å, a metal laminate film of a high melting point (for example, a $W/WN_x$ laminate film) 104 having a film thickness of, for example, 1000 Å, a silicon nitride film ($Si_3N_4$) 105 having a film thickness of, for example, 3000 Å, and a photoresist film 106 having a film thickness of, for example, 3000 Å and made of an organic material are sequentially laminated onto a silicon substrate 101.

Subsequently, as shown in FIG. 1(*b*), the photoresist film 106 is subjected to a patterning work comprising the exposing and developing processes according to the photolithography technique so as to become a predetermined shape (gate electrode shape) which is necessary for working the gate electrode. At this time, the silicon nitride film 105 under the photoresist film 106 plays a role for preventing a deterioration of resolution by preventing a reflection of the exposure in the photolithography.

After that, as shown in FIG. 1(*c*), a patterned photoresist film 106*a* is used as a mask and unnecessary portions excluding a portion 105*a* of the $Si_3N_4$ film 105 corresponding to a predetermined shape necessary for the gate electrode are removed by the RIE method.

According to the manufacturing method of the invention, after the unnecessary portions of the silicon nitride film 105 were removed and the etching mask consisting of the silicon nitride film 105*a* was formed, as shown in FIG. 2(*a*), the photoresist film 106*a* on the etching mask 105*a* is removed by etching.

After the photoresist film 106*a* was removed, the $Si_3N_4$ film 106*a* obtained by removing the unnecessary portions is used as a mask, unnecessary portions of the $W/WN_x$ laminate film 104 and polysilicon film 103 exposed from the mask 105*a* are removed by the RIE method, so that the gate electrode is formed.

Unlike the conventional method, according to the RIE method, since the photoresist 106*a* has already been removed, no organic system sub-product is formed as a protective film onto the side surface of the gate electrode.

In the invention, a protective film of the metal system is formed as a protective film in place of the conventional organic system sub-product.

In the embodiment, metal system sub-products (for example, $WCl_6$) 107 are sequentially formed on the side wall surfaces of the gate electrode (103*a* and 104*a*) in accordance with the progress of the etching by a reaction (for example, reaction formula: $W+3Cl_2 \rightarrow WCl_6$) between, for example, W of the $W/WN_x$ laminate film 104 and an etching gas (for example, $Cl_2$). According to the metal system sub-products 107, as shown in FIG. 2(*a*), the side surfaces of the gate electrode (103*a* and 104*a*) are covered, thereby preventing the $W/WN_x$ laminate film 104*a* and polysilicon film 103*a* from being excessively etched. The gate electrode (103*a* and 104*a*) whose vertical shape is maintained is formed by the etching protective films 107 made of the metal system sub-products.

The etching protective films 107 made of the metal system sub-products are oxidized by, for example, an ashing process using oxygen ($O_2$) plasma (for example, reaction formula: $2WCl_6+3O_2 \rightarrow 2WO_3+6Cl_2$).

The oxidized etching protective films 107 can be relatively easily removed by being cleaned for one minute by using an ammonium fluoride solution as shown in FIG. 2(*b*). The oxidized etching protective films 107 are sequentially dissolved from its surface by the ammonium fluoride solution or peeled off from the side surfaces of the gate electrode (for example, reaction formula: $WO_3+6NH_4F \rightarrow WF_6+6NH_3+3H_2O$).

As for the metal system sub-products 107, since it is considered that metal sub-products of different compositions are produced in accordance with compositions of the metal laminate film of a high melting point or conditions of an etching gas or the like which is used, it is difficult to determine the compositions. Similarly, it is also difficult to specify a reaction formula with respect to the dissolution of the metal system sub-products. Therefore, a producing reaction formula and a dissolving reaction formula of the metal system sub-products are no more than a principal reaction which is considered as a present situation is merely disclosed and the invention is not limited to those reaction formulae.

Ammonium fluoride which is used for removing the oxide of the metal system sub-products does not substantially react to the metal material of the gate electrode.

By adjusting an etching rate for the gate oxide film so as to be equal to or less than 10 Å/min by an adjustment, which will be explained hereinlater, of the ammonium fluoride solution, the oxide of the metal system sub-products 107 can be removed without extinguishing the gate oxide film 102. That is, by setting the etching rate of the ammonium fluoride solution for the gate oxide film so as to be equal to or less than 10 Å/min, a ratio (etching rate of the oxide of the metal system sub-products for the oxide)/(etching rate for the gate oxide film) of the ammonium fluoride solution can be set to 1.5 or more ($\geq 1.5$).

Therefore, the oxide of the metal system sub-products 107, that is, the metal system sub-products can be certainly removed without exercising a substantial adverse influence on the metal material of the gate electrode and without causing an extinction of the gate oxide film.

After the removal of the metal system sub-products 107, cleaning by a pure water rinse and a vapor dry by IPA (Isopropyl-Alcohol) for prevention of a watermark are executed in a manner similar to the conventional one. Post processes of the formed gate electrode are finished.

A principle of preferably removing the oxide (for example, $WO_3$) of the metal system sub-products by the ammonium fluoride solution (for example, $NH_4F$) will now be described in comparison with a case of using dilute hydrofluoric acid.

In case of using dilute hydrofluoric acid solution like a conventional manner, HF and $HF^{2-}$ contribute as main components of the etching reaction by the following dissociation formulae.

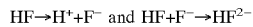

(for example, a contribution ratio of HF:80%, a contribution ratio of $HF^{2-}$:20%

On the other hand, in case of ammonium fluoride, $HF^{2-}$ mainly contributes as a main component of the etching reaction by the following dissociation formulae.

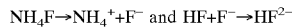

HF is formed by the reaction of $H_2O$ and $F^-$. At this time, the metal system sub-products are dissolved by, for example, the following reaction as formula.

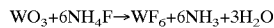

As mentioned above, in the ammonium fluoride solution according to the embodiment, it is shown that the solution is of the system of $HF^{2-}$ in which HF hardly exists as compared with the conventional case of solely using dilute hydrofluoric acid or the case where dilute hydrofluoric acid is mixed into the water and a mixture solution is used.

In the case where the HF system like dilute hydrofluoric acid as mentioned above strongly acts, since this HF system shows a higher etching rate than that of a thermal oxide film containing no impurity with respect to an oxide film containing boron as an impurity (for example, a BPSG film which is used as an interwire insulative film) or the like, various problems are caused.

On the other hand, in case of the ammonium fluoride solution according to the embodiment, the $HF^{2-}$ system mainly acts as mentioned above. Since an etching rate of the oxide film in such an $HF^{2-}$ system is lower than that in the conventional HF system, the etching can be easily controlled.

Moreover, in the $HF^{2-}$ system like an ammonium fluoride solution an etching rate proportional to a concentration can be obtained by using, for example, a solvent of a low dielectric constant such as acetic acid, tetrahydrofuran, IPA (Isopropyl-Alcohol), or the like.

Therefore, a desired etching rate can be relatively easily obtained by using the ammonium fluoride solution and also by using the solvent of a low dielectric constant as its solvent. Thus, an etching rate of a low speed and a constant speed of about 10 Å/min can be relatively easily obtained for the oxide film system as mentioned above.

For example, in case of using IPA (Isopropyl-Alcohol) as a solvent, it is desirable to use IPA whose water concentration is less than 1.5% in order to obtain the foregoing desired selection ratio. The ammonium fluoride solution can be constructed by such a solvent and a solute consisting of $NH_4HF_{2-}$. In case of using ethanol ($C_2H_5OH$) as a solvent, it is desirable to use ethanol whose water concentration is less than 1.5% in consideration of the foregoing selection ratio. The ammonium fluoride solution can be constructed by such a solvent and a solute consisting of $NH_4HF_2$.

As mentioned above, a chemical formula of either $NH_4F$ or $NH_4HF_2$ can be used as ammonium fluoride according to the embodiment. By using those ammonium fluoride solutions, the etching protective film consisting of the metal system sub-products can be easily removed without extinguishing the gate electrode and the gate oxide film as mentioned above.

Further, since ammonium fluoride can be cleaned with the pure water, the cleaning with the organic system solution in the conventional manner becomes unnecessary. Since the metal material (W/WN$_x$ laminate film) of the gate electrode is not dissolved as mentioned above, the metal contamination is prevented.

In case of using the organic system treatment solution using the hydrogen peroxide solution like a conventional manner, it is necessary to accelerate the etching rate by adjusting it to temperatures in a range of about 60° C. to 90° C. by a thermoregulator. However, since ammonium fluoride shows a predetermined etching rate at a room temperature for the oxide of the metal system sub-products, the conventional temperature adjustment is unnecessary and its handling becomes easy. Since ammonium fluoride can be easily obtained, it is suitable as a material of the treatment solution.

In the embodiment, since the etching protective film made of the metal system sub-products formed on the side surfaces of the gate electrode is oxidized and the oxides are removed by using the ammonium fluoride solution, the elution of the metal material of the gate electrode is prevented and the reduction of the gate electrode and the metal contamination of the environment are prevented. The extinction of the gate oxide film can be prevented by adjusting the ammonium fluoride solution to the etching rate of 10 Å/min or less for the gate oxide film.

Therefore, since the portion exposed from the gate of the gate oxide film can be used as a protective film of ion implantation and the silicon substrate is not exposed, the pattern defective due to the watermark by the insufficient dry can be prevented.

[Second Embodiment]

The second embodiment will now be described with reference to FIGS. 3(a) to 3(c), 4(a), and 4(b). FIGS. 3(a) to 3(c), 4(a), and 4(b) are step cross sectional views showing a manufacturing method of a semiconductor device according to the second embodiment.

Figure 3A:
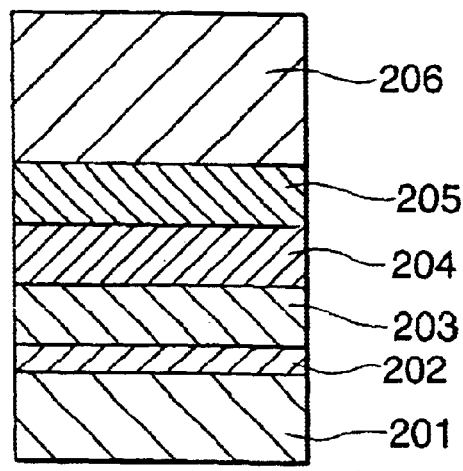
FIGS. 3(a) to 3(c) are cross sectional step views showing a manufacturing method of a semiconductor device according to the second embodiment of the invention.

First, as shown in FIG. 3(a), a gate insulative film 202 having a film thickness of, for example, 30 Å, a conductive polysilicon film 203 having a film thickness of, for example, 1000 Å, a W/WN$_x$ laminate film 204 having a film thickness of, for example, 1000 Å, a silicon nitride film ($Si_3N_4$) 205 having a film thickness of, for example, 3000 Å, and a photoresist film 206 having a film thickness of, for example, 3000 Å and made of an organic material are sequentially laminated onto a silicon substrate 201.

Figure 3B:
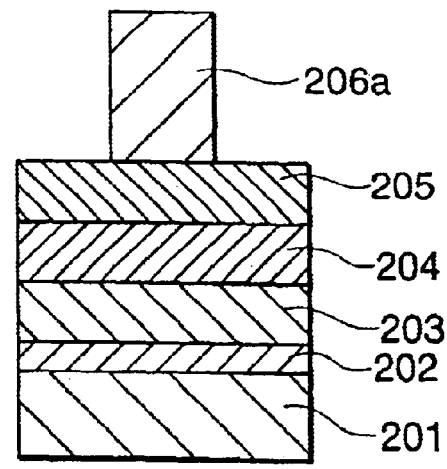

Subsequently, as shown in FIG. 3(b), the photoresist film 206 is subjected to a patterning work similar to that mentioned above so as to become a predetermined shape (gate electrode shape) which is necessary for working the gate electrode. Upon patterning of the photoresist film 206, the silicon nitride film 205 under this photoresist functions as a reflection preventing film similar to that mentioned above.

Figure 3C:
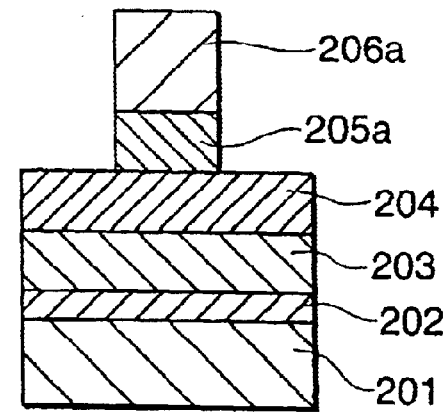

After that, as shown in FIG. 3(c), a patterned photoresist film 206a is used as a mask and unnecessary portions excluding a portion 205a of the $Si_3N_4$ film 205 corresponding to a predetermined shape necessary for the gate electrode are removed by the RIE method.

Figure 4A:
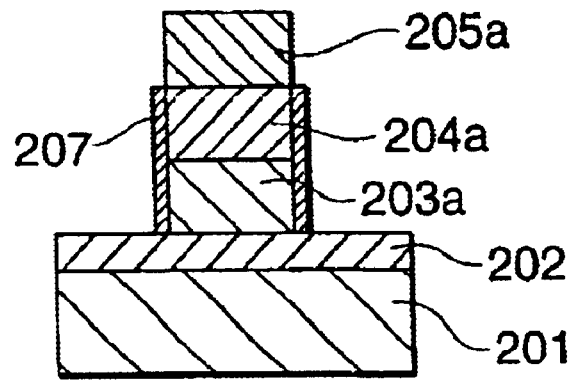
FIGS. 4(a) and 4(b) are cross sectional step views showing the manufacturing method of the semiconductor device according to the second embodiment.
Figure 4B:
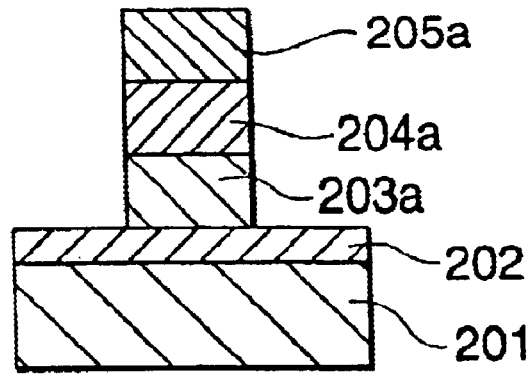
Figure 5A:
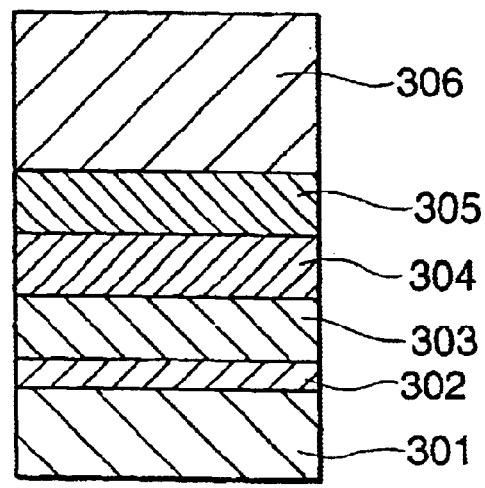
FIGS. 5(a) to 5(c) are cross sectional step views showing a conventional manufacturing method of a semiconductor device.
Figure 5B:
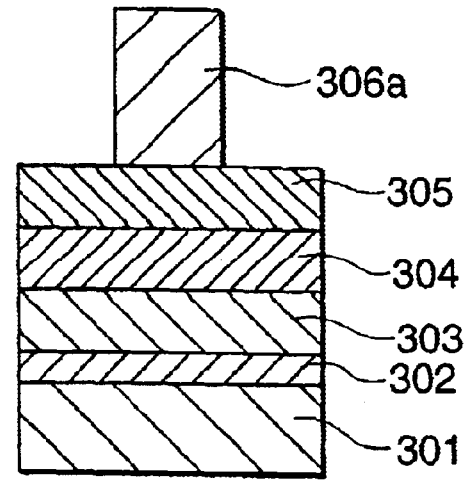
Figure 5C:
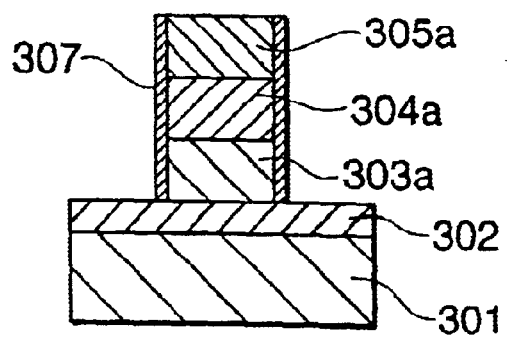
Figure 6:
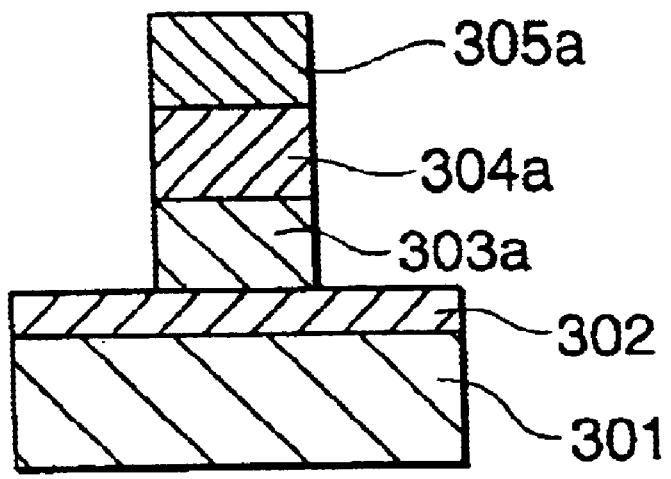
FIG. 6 is a cross sectional step view showing the conventional manufacturing method of the semiconductor device.

Further, as shown in FIG. 4(a), the photoresist film 206a is removed by etching. After that, the $Si_3N_4$ film 205a obtained by removing the unnecessary portions is used as a mask. The unnecessary portions of the W/WN$_x$ laminate film 204 and polysilicon film 203 which are exposed from the mask 205a are removed by the RIE method, and the gate electrode is formed.

According to the RIE method, in a manner similar to the first embodiment, metal system sub-products 207 are formed on the side wall surfaces of the gate electrode (203a and 204a) by the reaction between the $Si_3N_4$ film 205a which is used as an etching mask and the etching gas. As shown in FIG. 4(a), the metal system sub-products 207 cover the side surfaces of the gate electrode (203a and 204a), thereby preventing a W/WN$_x$ laminate film 204a and a polysilicon film 203a from being excessively etched. Thus, the gate electrode (203a and 204a) whose perpendicular shape is maintained is formed.

After that, the metal system sub-products 207 are oxidized by an ashing process using, for example, oxygen ($O_2$) plasma in a manner similar to the first embodiment.

Unlike the first embodiment, the oxidized metal system sub-products, that is, the etching protective films 207 are subjected to a cleaning process for 15 minutes by using, for example, a sulfate stock solution (sulfate having a high concentration of 90 wt % or more and non-hydrolyzed sulfate treatment solution) or a hydrochloric acid stock solution (hydrochloric acid having a high concentration of 30 wt % or more and non-hydrolyzed hydrochloric acid treatment solution). Thus, the oxide of the metal system sub-products 207 is removed from the gate electrode (203a and 204a) by dissolution or peel-off.

In the embodiment, the sulfate stock solution or hydrochloric acid stock solution is not diluted with the hydrogen peroxide ($H_2O_2$) or the like but used as it is. This is because in case of the sulfate stock solution or hydrochloric acid stock solution, its etching rate for the gate oxide film is equal to about 10 Å/min and the etching can be easily controlled.

Moreover, a reaction of the sulfate stock solution or hydrochloric acid stock solution to the metal components is more gentle than that of the dilute sulfate or dilute hydrochloric acid.

Therefore, by oxidizing the metal system sub-products 207 and removing the oxide of the metal system sub-products 207 by using the sulfate stock solution or hydrochloric acid stock solution, the etching protective film consisting of the metal system sub-products 207 can be removed without extinguishing the gate oxide film 202 and without substantially dissolving the metal components of the gate electrode.

After the metal system sub-products 207 were removed, the cleaning by a pure water rinse and a vapor dry by IPA (Isopropyl-Alcohol) are executed. Post processes of the gate electrode are finished.

As mentioned above, in case of using the conventional treatment solution which can eliminate the organic system contamination, an eliminating ability of the metal contamination is insufficient. However, the metal system sub-products can be optimally processed by processing with strong acid of the acid system by the foregoing method.

When the oxide of the metal system sub-products 207 is removed by using the sulfate stock solution or hydrochloric acid stock solution, it is unpreferable to use the hydrogen peroxide ($H_2O_2$) which accelerates the reaction. In this case, for example, although there is a method of using an ozone solution ($H_2O_3$) of a very low concentration, since it is necessary to control the ozone solution to an extremely low concentration, the sulfate stock solution or hydrochloric acid stock solution is used without being substantially diluted.

In case of the sulfate stock solution or hydrochloric acid stock solution, since an etching rate for the gate oxide film 202 and the metal components of the gate electrode is lower than those of their dilute solutions, the oxide of the metal system sub-products 207 can be relatively easily and preferably removed without largely damaging the gate oxide film 202 and the metal components of the gate electrode.

In the embodiment, since sulfate or hydrochloric acid as a general treatment solution is used, the removing step of the oxide of the metal system sub-products 207 becomes easy.

In the embodiment, since the etching protective films consisting of the metal system sub-products formed on the side surfaces of the gate electrode are removed by using the sulfate stock solution or hydrochloric acid stock solution, an elution of the treatment solution in the metal portion as a gate electrode material in the post processes of the etching can be prevented. Thus, the reduction of the electrode material and the metal contamination of the environment can be prevented. In case of the sulfate stock solution or hydrochloric acid stock solution, since the etching rate for the gate oxide film is equal to or less than 10 Å/min, the removal of the gate oxide film is prevented. Thus, the portion exposed from the gate of the gate oxide film can be used as a protective film of ion implantation. Since the silicon substrate is not exposed, the pattern defective due to the watermark by the insufficient dry can be prevented.

Although the preferred embodiments of the present invention have been described above, the invention is not limited to them. Those skilled in the art will be able to presume many variations and modifications within the scope of the technical idea disclosed in claims of the invention and those variations and modifications are also incorporated in the technical scope of the present invention.

For example, although the embodiments have been described with respect to the example in which the $W/WN_x$ laminate film is used as a metal film/under film, the invention can be also applied to gate electrodes made of any metal system materials such as a $W/TiN_x$ laminate film and the like.

Although the embodiments have been described with respect to the example in which the metal system sub-products formed on the side walls of the gate electrode are oxidized by oxygen ashing, the invention can be also embodied by another oxidizing method.

Although the second embodiment has been described with respect to the example in which the metal system sub-products formed on the side walls of the gate electrode are removed by using the sulfate stock solution or hydrochloric acid stock solution, the invention can be also embodied by using the sulfate or hydrochloric acid solution having any concentration so long as an etching rate for the gate oxide film is adjusted to 10 Å/min or less.

Although the embodiments have been described with respect to the example in which the gate electrode is formed by using the silicon nitride film ($Si_3N_4$ film) as a reflection preventing film and an etching mask, in place of the silicon nitride film, the silicon oxide film can be also used as a reflection preventing film and an etching mask.

Since the metal system sub-products generated upon etching at the time of the gate electrode working are removed by using the acid system treatment solution, the elution of the treatment solution in the metal portion as a gate electrode material in the post processes of the etching can be prevented. Thus, the reduction of the electrode material and the metal contamination of the environment can be prevented. In case of the acid system treatment solution, since the etching rate for the gate oxide film has been adjusted to 10 Å/min or less, the gate oxide film is not perfectly extingished. Thus, since the silicon substrate is not exposed, the pattern defective due to the insufficient dry can be prevented.

What is claimed is:

1. A manufacturing method of a semiconductor device in which a gate electrode, at least a part of which is made of a metal material, is formed on a gate insulative film formed on a semiconductor substrate, comprising:

forming the gate electrode while forming metal system sub-products onto side walls of said gate electrode, by etching a gate electrode layer formed on said semiconductor substrate;

oxidizing said metal system sub-products formed on the side walls of said gate electrode; and removing said oxidized metal system sub-products using a solution having an etching rate for said gate insulative film adjusted to be equal to or less than 10 Å/min.

2. A manufacturing method of a semiconductor device in which a gate electrode, at least a part of which is made of a metal material, is formed on a gate insulative film formed on a semiconductor substrate, comprising:

sequentially forming the gate insulative film, a gate electrode layer, and a silicon nitride film or a silicon oxide film onto said semiconductor substrate, at least a part of said gate electrode layer is made of a metal material;

etching said silicon nitride film or silicon oxide film into a predetermined shape;

forming the gate electrode while forming metal system sub-products onto side walls of said gate electrode, by etching said gate electrode layer using said silicon nitride film or silicon oxide film etched in said predetermined shape as a mask;

oxidizing said metal system sub-products formed on the side walls of said gate electrode; and removing said oxidized metal system sub-products.

3. A method according to claim 2, wherein said removing said oxidized metal system sub-products is executed by using an ammonium fluoride solution.

4. A method according to claim 3, wherein said ammonium fluoride solution has an etching rate for said gate insulative film adjusted to be equal to or less than 10 Å/min.

5. A method according to claim 3, wherein a solvent of said ammonium fluoride solution has a low dielectric constant.

6. A method according to claim 5, wherein said solvent having the low dielectric constant is acetic acid or tetrahydrofuran.

7. A method according to claim 2, wherein said removing said oxidized metal system sub-products is executed by using sulfate.

8. A method according to claim 7, wherein said sulfate has an etching rate for said gate insulative film adjusted to be equal to or less than 10 Å/min.

9. A method according to claim 8, wherein said sulfate is a non-hydrolyzed sulfate stock solution.

10. A method according to claim 2, wherein the step of removing said oxidized metal system sub-products is executed by using hydrochloric acid.

11. A method according to claim 10, wherein said hydrochloric acid has an etching rate for said gate insulative film adjusted to be equal to or less than 10 Å/min.

12. A method according to claim 11, wherein said hydrochloric acid is a non-hydrolyzed hydrochloric acid stock solution.

13. A method according to claim 2, wherein said metal system sub-product is a product which is formed by a reaction of a metal material of said gate electrode and an etching material which is used to etch said gate electrode layer during said forming the gate electrode.

14. A method according to claim 13, wherein said metal system sub-product is a product containing at least $WCl_6$.

15. A method according to claim 2, wherein the etching of said gate electrode layer is executed by a reactive ion etching method.

16. A method according to claim 2, wherein said oxidizing said metal system sub-products formed on the side walls of said gate electrode comprises ashing using oxygen.

17. A manufacturing method of a semiconductor device having a gate electrode which is formed on a gate oxide film on a semiconductor substrate and which has a metal material layer, comprising:

depositing a gate electrode layer for said gate electrode onto said gate oxide film;

forming a reflection preventing film layer and a photoresist material layer made of an organic material sequentially onto said gate electrode layer;

forming a resist mask in a desired shape from said photoresist material layer by a photolithography technique;

performing a selective etching process on said reflection preventing film layer using said resist mask, thereby forming an etching mask corresponding to said resist mask from said reflection preventing film layer;

removing said resist mask;

performing an etching process using said etching mask after said removing said resist mask, to remove a portion of said gate electrode layer exposed from said etching mask, and sequentially growing etching protective films of a metal system onto side portions of said gate electrode that remain after removal of said gate electrode layer;

oxidizing said etching protective films; and removing said oxidized etching protective films from the side portions of said gate electrode.

18. A method according to claim 17, wherein said reflection preventing film is either a silicon nitride film or a silicon oxide film.

19. A method according to claim 17, wherein said etching protective films are removed by using an ammonium fluoride solution.

20. A method according to claim 17, wherein said etching protective films are removed by using a strong liquid acid.

21. A method according to claim 1, wherein the solution is an ammonia flouride solution.

* * * * *